US012621013B2

(12) United States Patent
Fletcher et al.

(10) Patent No.: US 12,621,013 B2
(45) Date of Patent: May 5, 2026

(54) LOW COMPLEXITY DIRECT-TO-LUT DIGITAL PRE-DISTORTION METHOD

(71) Applicant: SAMSUNG ELECTRONICS CO., LTD., Suwon-si (KR)

(72) Inventors: Paul Nicholas Fletcher, Impington (GB); Donghan Kim, Cambridge (GB); Fei Tong, Bassingbourn (GB); Ziming He, Barnet (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/422,913

(22) Filed: Jan. 25, 2024

(65) Prior Publication Data

US 2024/0348273 A1 Oct. 17, 2024

(30) Foreign Application Priority Data

Apr. 12, 2023 (KR) ........................ 10-2023-0048176

(51) Int. Cl.
$$H04B\ 1/04 \qquad (2006.01)$$
$$H03F\ 1/32 \qquad (2006.01)$$
$$H03F\ 3/24 \qquad (2006.01)$$

(52) U.S. Cl.
CPC ......... H04B 1/0475 (2013.01); H03F 1/3241 (2013.01); H03F 3/245 (2013.01); *H03F 2200/451* (2013.01); *H04B 2001/0408* (2013.01)

(58) Field of Classification Search
CPC .......... H04B 1/0475; H04B 2001/0408; H03F 1/3241; H03F 3/245; H03F 2200/451

USPC ......................................................... 375/297
See application file for complete search history.

(56) References Cited

U.S. PATENT DOCUMENTS

| | | | | |
|---|---|---|---|---|
| 5,610,554 | A * | 3/1997 | Anvari | H03F 1/3235 |
| | | | | 330/151 |
| 7,333,559 | B2 * | 2/2008 | Song | H03F 1/3247 |
| | | | | 375/296 |
| 8,150,336 | B2 * | 4/2012 | Waheed | H03F 1/3241 |
| | | | | 375/296 |
| 10,897,276 | B2 | 1/2021 | Megretski et al. | |
| 2016/0127111 | A1 * | 5/2016 | Chang | H04B 1/0458 |
| | | | | 370/277 |
| 2017/0201368 | A1 * | 7/2017 | Hou | H04L 5/0048 |

(Continued)

FOREIGN PATENT DOCUMENTS

CN      102427437 A      4/2012

*Primary Examiner* — Kevin M Burd
(74) *Attorney, Agent, or Firm* — Sughrue Mion, PLLC

(57) ABSTRACT

A distortion apparatus for a power amplifier comprises: pre-distortion circuitry that comprises a memory polynomial look-up-table (LUT) circuit; and post-distortion circuitry that updates the pre-distortion circuitry based on an output of the power amplifier. The pre-distortion circuitry comprises a plurality of LUTs. Each LUT corresponds to a different memory depth of a memory polynomial of a Volterra series. Each LUT indexed by an instantaneous power of an input sample delayed by an amount corresponds to a respective memory depth of each LUT. An output of the memory polynomial LUT circuit corresponds to a summation of an output of each LUT multiplied by the input sample delayed by the amount corresponding to the respective memory depth of each LUT, and an output of the pre-distortion circuitry is provided to the power amplifier.

19 Claims, 10 Drawing Sheets

(56) References Cited

U.S. PATENT DOCUMENTS

| | | | |
|---|---|---|---|
| 2022/0190851 A1* | 6/2022 | Pawliuk | H04B 1/0475 |
| 2022/0200618 A1 | 6/2022 | Sanchez et al. | |
| 2025/0096829 A1* | 3/2025 | Vorobyev | H03F 1/3241 |

* cited by examiner

200

700

LOW COMPLEXITY DIRECT-TO-LUT DIGITAL PRE-DISTORTION METHOD

CROSS-REFERENCE TO RELATED APPLICATION

This application claims priority to Korean Patent Application No. 10-2023-0048176, filed on Apr. 12, 2023, the disclosures of each of which are incorporated by reference herein their entirety.

TECHNICAL FIELD

This disclosure is directed to pre-distortion circuitry that applies a direct-to-LUT digital pre-distortion method to a power amplifier.

BACKGROUND

A wireless transmitter includes a power amplifier (PA) that provides a final level of amplification of a radio frequency (RF) signal. The PA must provide sufficient amplification of the signal such that when radiated from an antenna of the wireless transmitter, the signal is at a power level that is sufficient to reach an antenna of a receiver so that data encoded in a modulated RF signal can be correctly decoded. Furthermore, it is desirable for the PA to operate in a condition where it is power efficient (e.g., provides a power amplification to the signal without consuming or wasting power itself). Regardless of the type of PA (e.g. class, semi-conductor make-up), to maximize power efficiency, it is necessary to operate the PA close to a compression region, which is a region of the PA characteristic where high signal amplitude peaks are distorted by the PA's inability to provide sufficient power. Modern wireless modulation formats are a non-constant envelope with a peak-to-average power ratio (PAPR) in excess of 10 dB not being uncommon. Operating the PA at a power level such that the peaks of the signal do not enter the compression region and undergo distortion mandates that the PA must be operated in a so-called 'backed off' state, which results in the PA operating in a highly inefficient manner, thereby leading to non-optimal transmission from the wireless transmitter.

SUMMARY

According to one or more embodiments, a distortion apparatus for a power amplifier comprises: pre-distortion circuitry that comprises a memory polynomial look-up-table (LUT) circuit; and post-distortion circuitry that updates the pre-distortion circuitry based on an output of the power amplifier. The pre-distortion circuitry comprises a plurality of LUTs. Each LUT corresponds to a different memory depth of a memory polynomial of a Volterra series. Each LUT indexed by an instantaneous power of an input sample delayed by an amount corresponds to a respective memory depth of each LUT. An output of the memory polynomial LUT circuit corresponds to a summation of an output of each LUT multiplied by the input sample delayed by the amount corresponding to the respective memory depth of each LUT, and an output of the pre-distortion circuitry is provided to the power amplifier.

According to one or more embodiments a distortion apparatus for a power amplifier, comprising: pre-distortion circuitry that comprises a cross-term circuit; and post-distortion circuitry that updates the pre-distortion circuitry based on an output of the power amplifier. The cross-term circuit comprises at least one LUT and is configured to receive a first delayed version of an input sample and a second delayed version of the input sample delayed by a different amount than the first delayed version of the input sample. The at least one LUT is indexed based on an instantaneous power of the second delayed version of the input sample. An output of the first cross-term circuit corresponds to a multiplication of (i) a first exponential function applied to the first delayed version of the input sample with (ii) an output of the at least one LUT.

According to one or more embodiments, the distortion apparatus comprising: pre-distortion circuitry that comprises a cross-term circuit; and post-distortion circuitry that updates the pre-distortion circuitry based on an output of the power amplifier. The cross-term circuit comprises at least one LUT and is configured to receive the first delayed version of the input sample, a second delayed version of the input sample, and a third delayed version of the input sample that is delayed by a different amount than first delayed version of the input sample and the second delayed version of the input sample. The at least one LUT is indexed based on the instantaneous power of the second delayed version of the input sample. An output of the second cross-term circuit corresponds to a multiplication of (i) the first exponential function applied to the first delayed version of the input sample with (ii) the output of the at least one LUT, and with (iii) a second exponential function applied to the second delayed version of the input sample.

BRIEF DESCRIPTION OF DRAWINGS

Further features, the nature, and various advantages of the disclosed subject matter will be more apparent from the following detailed description and the accompanying drawings in which.

DETAILED DESCRIPTION

Figure 1:
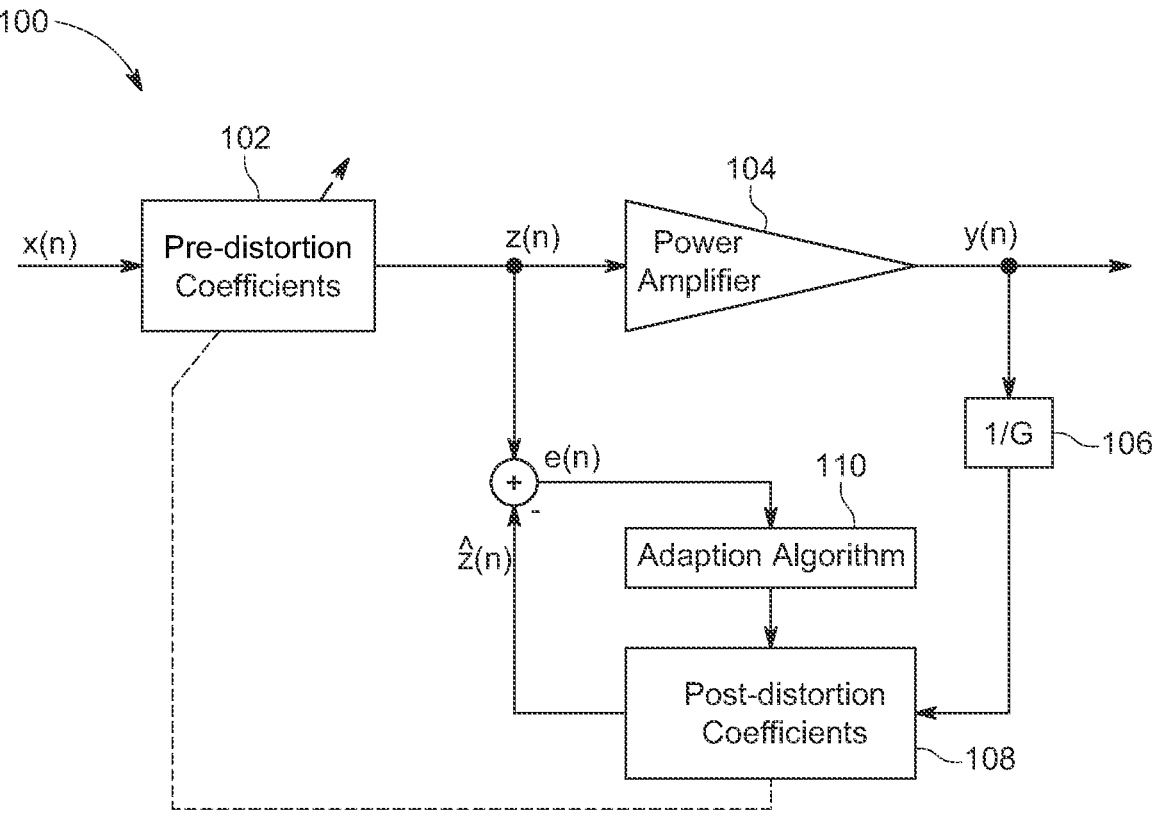
FIG. 1 is a schematic illustration of an indirect learning pre-distortion architecture, in accordance with embodiments of the present disclosure.

The following detailed description of example embodiments refers to the accompanying drawings. The same reference numbers in different drawings may identify the same or similar elements.

The foregoing disclosure provides illustration and description, but is not intended to be exhaustive or to limit the implementations to the precise form disclosed. Modifications and variations are possible in light of the above disclosure or may be acquired from practice of the implementations. Further, one or more features or components of one embodiment may be incorporated into or combined with another embodiment (or one or more features of another embodiment). Additionally, in the flowcharts and descriptions of operations provided below, it is understood that one or more operations may be omitted, one or more operations may be added, one or more operations may be performed simultaneously (at least in part), and the order of one or more operations may be switched.

It will be apparent that systems and/or methods, described herein, may be implemented in different forms of hardware or firmware. The actual specialized control hardware used to implement these systems and/or methods is not limiting of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Also, as used herein, the terms "has," "have," "having," "include," "including," or the like are intended to be open-ended terms. Further, the phrase "based on" is intended to mean "based, at least in part, on" unless explicitly stated otherwise. Furthermore, expressions such as "at least one of [A] and [B]" or "at least one of [A] or [B]" are to be understood as including only A, only B, or both A and B.

Reference throughout this specification to "one embodiment," "an embodiment," or similar language means that a particular feature, structure, or characteristic described in connection with the indicated embodiment is included in at least one embodiment of the present solution. Thus, the phrases "in one embodiment", "in an embodiment," and similar language throughout this specification may, but do not necessarily, all refer to the same embodiment.

Furthermore, the described features, advantages, and characteristics of the present disclosure may be combined in any suitable manner in one or more embodiments. One skilled in the relevant art will recognize, in light of the description herein, that the present disclosure may be practiced without one or more of the specific features or advantages of a particular embodiment. In other instances, additional features and advantages may be recognized in certain embodiments that may not be present in all embodiments of the present disclosure.

Embodiments of the present disclosure are directed to a high performance memory digital pre-distortion apparatus and method. Particularly, the embodiments of the present disclosure enable fast on-chip training for pre-distortion structures that linearize power amplifiers operating with wideband signals, where memory effects and cross-term distortion terms become a significant limitation to power amplifier linearization. By direct population of a Look Up Table (LUT), the embodiments of the present disclosure may be implemented on-chip and hence, may remove the need for a digital signal processor (DSP), providing a significant potential power and cost saving as well as a considerable reduction in training time.

Digital Pre-distortion (DPD) is a signal processing technique commonly used to enhance an efficiency of a PA by allowing operation such that peak excursions of a signal push the signal into a compression region of the PA. Without DPD during these signal excursions, the signal will undergo significant distortion resulting in spectral re-growth with commensurate degradation in an adjacent channel leakage ratio (ACLR) and error-vector magnitude (EVM). The DPD intentionally applies distortion to the signal before the signal is sent to the PA. The applied distortion is designed such that when the distorted signal is further distorted by the PA, a resulting amplified signal appears as a linear version of an original signal, where the ACLR and EVM may be restored to desired levels.

An example pre-distortion function may be obtained from a Volterra series representation of a weak non-linear system, shown in Eq. (1) for a discrete digital system:

$$y(l) = \hspace{9cm} \text{Eq. (1)}$$

$$\sum_{k=1}^{K} \left[ \sum_{m_1=-\infty}^{\infty} \cdots \sum_{m_k=-\infty}^{\infty} h_k(m_1, \ldots, m_k) \prod_{i=1}^{k} x(l - m_i) \right]$$

As understood by one of ordinary skill in the art, implementation of the Volterra series according to Eq. (1) is very difficult to implement in hardware. Therefore, it is common to reduce complexity of a system by ignoring all off-diagonal terms of Volterra kernel coefficients hr. Furthermore, by writing the Volterra series in the form of an equivalent complex baseband model and imposing causality conditions, Eq. (1) takes a following form:

$$y_l = \sum_{\substack{k=1 \\ k \text{ odd}}}^{K} \sum_{m=0}^{M-1} h_{km} x(l - m) |x(l - m)|^{k-1} \qquad \text{Eq. (2)}$$

In one or more examples, only odd ordered polynomial terms may be considered since these terms contribute to in-band distortion. These terms may be referred to as a "Memory Polynomial" form of the Volterra series. The Volterra Kernels may be written as simple coefficients indexed by a memory polynomial and a memory depth order.

In one or more examples, calculating coefficients for the memory polynomial and cross-terms of a pre-distortion circuitry may be performed using an adaptive processing scheme, whereby waveforms at an input and an output are observed, and the coefficients are modified to minimize a predefined cost-function. This processing is described in further detail below, and as understood by one of ordinary skill in the art, may be computationally expensive. The embodiments of the present disclosure are directed to computing the pre-distortion function, which is computationally less expensive and applicable to real-time application.

FIG. 1 is a schematic illustration of an indirect learning pre-distortion architecture, in accordance with embodiments of the present disclosure.

FIG. 1 shows a signal path of a DPD system 100 with a coefficient calculation based according to an "Indirect Learning" (IL) architecture. The signal path of the DPD system may include a pre-distortion block 102 which applies a memory polynomial and a cross-term non-linearity to an input samples x(n) to generate pre-distorted samples z(n). The pre-distorted samples z(n) may be input to a PA 104, which generates output samples y(n). The output samples y(n) may be provided to a gain block 106, and subsequently, to a post-distortion block 108. Based on these output samples y(n), the post-distortion block 108 may produce feedback samples $\hat{z}(n)$. The output of the post-distortion block 108 may be used to update coefficients of the pre-distortion block 102. An error e(n) may be calculated based on a difference between the feedback samples $\hat{z}(n)$ and the input samples z(n). The error e(n) may be provided to an adaption algorithm 108, results of which are used to update coefficients of the post-distortion block 108.

If the pre-distortion function is a non-linear inverse of the PA, then the relationship holds according to Eq. 3 where G (e.g., block 106 in FIG. 1) is the PA gain.

$$y(n) = Gx(n) \qquad \text{Eq. (3)}$$

The coefficients of the pre-distortion non-linearity may be computed by applying the theory of the equivalence of $p^{th}$ order pre- and post-inverse non-linearities, which states that the $p^{th}$ order post-inverse non-linearity is also a pre-inverse non-linearity up to the $p^{th}$ order. Therefore, a matrix Y may be computed in which the columns of the matrix Y are the basis functions of the non-linearity applied to samples y(n) and the coefficients, c, of a post-inverse nonlinearity and are written as a vector a such that:

$$Yc = z \qquad \text{Eq. (4)}$$

The vector z may be composed of samples z(n). In one or more examples, a block of N samples are taken to construct the matrix Y and vector z such that the number of rows in matrix Y and vector z is N. The form of the basis vectors that compose the columns of matrix Y may be generalized from the memory polynomial of Eq. (2) to have the form:

$$z(n - d_0)^{p_0} z(n - d_1)^{p_1} |z(n - d_2)|^{p_2} \qquad \text{Eq. (5)}$$

In Eq. (5), the parameters $d_0$, $d_1$, and $d_2$ are the delays of the samples z(n) which are participating in the instantaneous value of the non-linearity at time n.

In one or more examples, the delays may be taken from a small range of integer values, depending on the reactive memory properties of the PA. The parameters $p_0$, $p_1$, and $p_2$ denote the powers in which each term is raised. Since the powers take the value of zero or a positive integer, the value of −1 may be reserved to denote a conjugation of the term. In one or more examples, no other values other than the reserved value are valid. As understood by one of ordinary skill in the art, the reserved value may be set to any suitable value that denotes a conjugation. The set of parameters $\{d_0$ $d_1$ $d_2$ $p_0$ $p_1$ $p_2\}$ may completely define samples of the form of Eq. (2) and therefore, each column of matrix Y, also referred to as basis vector.

Eq. (5) may be referred to as a generalized form of the memory polynomial functions shown in Eq. (2). Using this definition, a large range of distortion product terms (e.g., basis vectors) may be defined. These distortion product terms may be categorized as either being of Form 1, Form 2 or Form 3.

In one or more examples, Form 1 may be referred to as a memory polynomial. For example, Form 1 terms may be terms of the memory polynomial as defined in Eq. (2). For example, $p_0=0$, $p_1=1$, and $p_2=2$, 4, 6 . . . . In one or more examples, defining $p_0=0$ means that this term no longer participates in the basis vector.

In one or more examples, Form 2 may be referred to as a two-sample cross-term. For example, Form 2 terms may be terms of a two sample cross-term. Similar to Form 1, there may be only two participating samples since $p_0=0$. The values of $p_1=1$ and $p_2=2$, 4, 6 . . . define the order of the cross-term. A cross-term may be a term where samples of different delays take part in forming the basis vector sample. For example, the delays of the two participating samples may be different from each other (e.g., $d_1 \neq d_2$). In one or more examples, the difference between delays $d_1$ and $d_2$ may be only a single sample.

In one or more examples, Form 3 may be referred to as a three sample cross-term. For example, Form 3 may be a cross-term where three samples participate. Each value of $p_0$, $p_1$ and $p_2$ may be chosen independently (e.g., including −1 to indicate a conjugation for $p_0$, $p_1$) as well as the delays $d_0$, $d_1$, and $d_2$.

The combination of Form 1, Form 2 and For 3 terms may be used in the construction of the (N×L) basis matrix Y (e.g., each of the L columns being of one of the Forms). In one or more examples, the basis matrix Y of basis vectors may be constructed such that matrix Y provides the closest inverse to the non-linearity characteristic. The L coefficients, one for each of the basis vectors that creates the inverse, may be obtained by solving the set of overdetermined equations given by Eq. (4) in the least squares sense (e.g., minimize the square of the residual or error). This solution has the well-known form:

$$c_{LS} = \left(Y^H Y\right)^{-1} Y^H z \qquad \text{Eq. (6)}$$

In one or more examples, the solution of this equation requires that a block of N contiguous samples of z(n) and y(n) are taken, the basis matrix is computed, and the least square coefficient vector is computed according to Eq. (6). The computed post-distortion coefficients may be subsequently applied as a pre-distorting function, which acts to pre-distort the input signal such that the combination of the pre-distorting non-linearity and the PA's non-linearity results in a linearly amplified version of the input signal at the PA output. Due to a compression offered by the PA, this process is repeated a small number of times for the coefficients to converge to the optimum pre-distorting solution.

The method of the least squares (LS) computation described by Eq. (5) assumes that blocks of samples z(n) and y(n), for n=1 . . . . N, are taken together and processed. While there are a number of strategies for solving Eq. (5) (e.g., using QR-Decomposition), the computational load required to compute the solution remains heavy. For this reason, DPD systems tend to employ a digital signal processing (DSP) engine that processes captured blocks of data taken at the PA input and output and updates the coefficients of the pre-distorter. However, this approach results in a slow update rate of the DPD since the data transfer to/from the DSP and processing time of the DSP itself can take some time. Further, unless the system makes use of the DSP for other reasons, this approach is inefficient since the DSP is redundant after training of the DPD is complete.

As illustrated in FIG. 1, to avoid these issues, the DPD may be run in a sample-by-sample fashion, where a single sample at the PA input and output, (z(n) and y(n), respectively) are processed to provide a single update to the coefficient. This process may be repeated in an iterative fashion until the same LS solution is ultimately reached as solving the batch of samples in Eq. (6). The disadvantage of this approach is that the processing must operate at the sample rate of the forward path and therefore, requires very high speed hardware processing. Referring to FIG. 1, the instantaneous error may be calculated between the input sample to the PA and the post-distorted output as follows:

$$e(n) = z(n) - \hat{z}(n) \qquad \text{Eq. (7)}$$

In one or more examples, a cost-function may be defined as the instantaneous squared error as follows:

$$J(n) = \frac{1}{2}|e(n)|^2 = \frac{1}{2}e(n)e*(n) \qquad \text{Eq. (8)}$$

To reach the LS solution, the iterative update to coefficients may be performed in an opposite direction to the gradient vector as follows:

$$c(n+1) = c(n) - \mu \nabla J(n) \qquad \text{Eq. (9)}$$

In Eq. (9), c (n) may be the coefficient vector at time epoch n. Therefore, at time n, the output may be defined as follows:

$$\hat{z}(n) = c^T(n)u(n) \qquad \text{Eq. (10)}$$

In Eq. (10), u(n) may be a column vector composed of the row of the current value of the basis vector values. For example, assuming Form 1 basis vectors, then u(n) would have the following form:

$$u(n) = \qquad \text{Eq. (11)}$$

$$\left[ y(n) \quad \dots \quad y(n)|y(n)|^{K-1} \quad \dots \quad \begin{matrix} y(n- \\ (M-1)) \end{matrix} \quad \dots \quad \begin{matrix} y(n-(M-1)) \\ |y(n- \\ (M-1))|^{K-1} \end{matrix} \right]^T$$

The instantaneous gradient vector may be expanded as follows:

$$\nabla J(n) = \frac{\partial J(n)}{\partial c^T(n)} = \frac{1}{2}\frac{\partial}{\partial c^T(n)}\left[z(n) - c^T(n)u(n)\right]\left[z(n) - c^T(n)u(n)\right]^* \qquad \text{Eq. (12)}$$

$$\frac{1}{2}\frac{\partial J(n)}{\partial c^T(n)} = -e*(n)u(n) \qquad \text{Eq. (13)}$$

Substituting these equations back into Eq. (9) results in the update equation for the coefficients as follows:

$$c(n+1) = c(n) + \mu e*(n)u(n) \qquad \text{Eq. (14)}$$

This process may be referred to as the well-known Least Mean Squares (LMS) update equation, which shows that given the error sample e (n) at time n and the current state of the post-distorter (or equivalently, pre-distorter) u(n), an update to the weights may be determined such that the overall LS solution is ultimately reached. The parameter μ may be the update rate, which controls how quickly the error surface is traversed and how close to the true LS solution the system converges.

Figure 2:
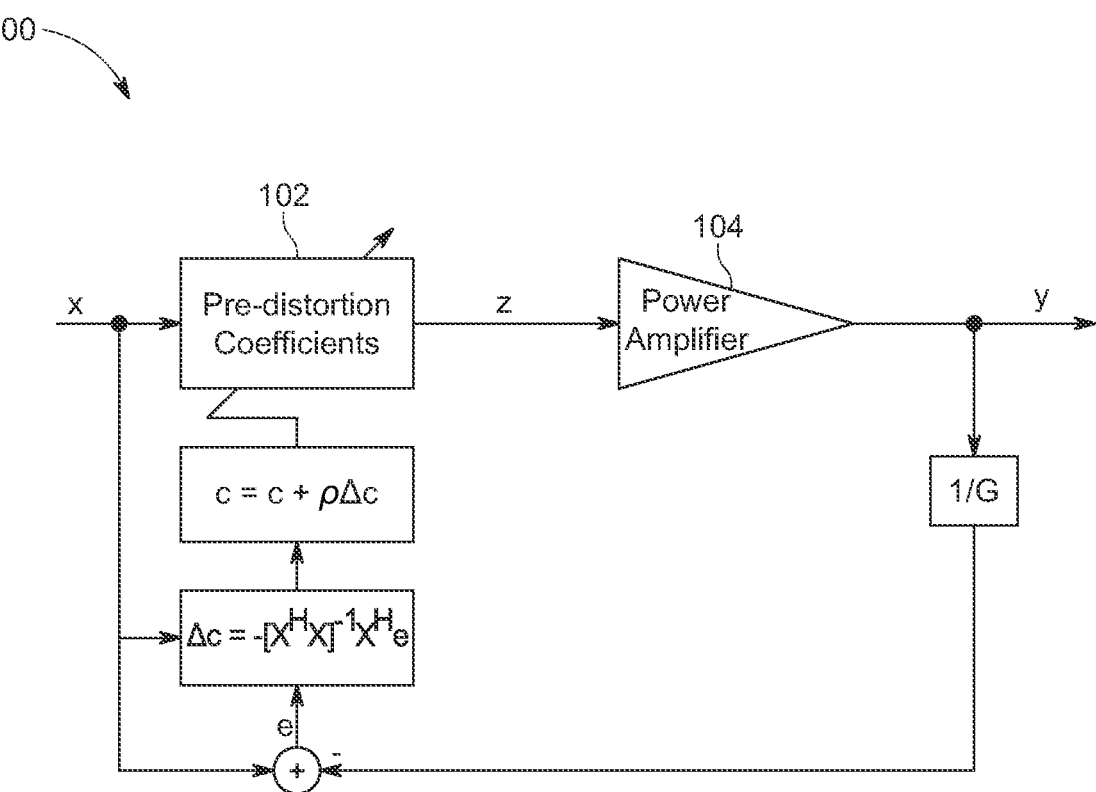
FIG. 2 is a schematic illustration of a closed-loop pre-distortion architecture, in accordance with embodiments of the present disclosure.

FIG. 2 is a schematic illustration of a closed-loop pre-distortion architecture, in accordance with embodiments of the present disclosure. FIG. 2 illustrates an example embodiment for adaption of the coefficients of a DPD system 200, which may be referred to as the so-called "Closed-Loop Error-Correction" architecture.

In this architecture, in one or more examples, only the input waveform and the output waveform samples are required by the algorithm. The CL-EC approach assumes that the PA's weak non-linearity to be quasi-linear over a small interval of the input waveform. Under this assumption, if the error between the input and output waveform is written (e, x and y are N×1 column vectors):

$$e = x - y \qquad \text{Eq. (15)}$$

A small change to the coefficients Δc of the pre-distorted may be made to remove this error:

$$X\Delta c = -e \qquad \text{Eq. (16)}$$

In Eq. (16), the matrix X is the matrix of basis functions constructed from the input samples x(n). The parameter Δc may be computed in the LS sense according to:

$$\Delta c = -(X^H X)^{-1}X^H e \qquad \text{Eq. (17)}$$

In one or more examples, the coefficients are updated according to:

$$c(m + 1) = c(m) + \rho \Delta c \qquad \text{Eq. (18)}$$

In one or more examples, the CL-EC may be an iterative algorithm that moves closer to removing the error between the output waveform and the input waveform at each iterative step. Depending on the PA's non-linear characteristics and therefore, the validity of the quasi-linear assumption, the CL-EC algorithm may take many iterations to converge. In one or more examples, the convergence rate is dependent upon the parameter $\rho$. When converged, the output waveform may be identical to the input waveform and the PA is effectively linearized. Furthermore, when the error e becomes zero, no further updates may be made to the coefficients.

The equation for the change in coefficients (e.g., Eq. (17) above) may be written for the case where a set of contiguous samples are processed as a single vector. In this case, the samples are those of the error calculated from Eq. (15). The same disadvantages outlined for the IL architecture also apply to the CL-EC architecture with respect to using a DSP processor to perform the heavy computational load of computing Eq. (17). However, in the same way as the LMS algorithm was applied to the LS coefficient calculation for the IL method, thereby enabling a sample-by-sample update, the LMS algorithm may also be applied to the CL-EC algorithm, also enabling a sample-by-sample update. The change in coefficients at time n required to reduce the error is taken on the basis of a single error sample:

$$\Delta c(n) = e * (n)u(n) \qquad \text{Eq. (19)}$$

In Eq. (19), u(n) may be calculated as a row of the basis matrix X, according to Eq. (11), using the input samples x(n). The variable $e*(n)$ may be the current error sample. The coefficient change may be propagated to the coefficient update as:

$$c(n + 1) = c(n) + \rho \Delta c(n) = c(n) + \rho e * (n)u(n) \qquad \text{Eq. (20)}$$

In Eq. (20), $\rho$ is the update rate. Examination of the sample-by-sample LMS coefficient update equations for IL and CL-EC, Eqs. (14) and (20), respectively, show that the form of the equations is identical. The differences are in how the error samples are calculated and the samples, either input x(n) or PA output y(n), which are used to construct the basis vector.

According to one or more embodiments, the least squares processing for DPD described above results in the set of coefficients applied to the basis functions, where the coefficients may be determined from the selection of Form 1, Form 2 or Form 3 distortion terms. In an implementation of the pre-distorter, each form may be computed through a series of multiplications and summations. For example, considering Form 1 terms, the m-th memory depth term with odd order terms up to order 7 may be computed as:

$$c_{1m}x(l - m) + c_{3m}x(l - m)|x(l - m)|^2 + \qquad \text{Eq. (21)}$$

$$c_{5m}x(l - m)|x(l - m)|^4 + c_{7m}x(l - m)|x(l - m)|^6$$

The computational complexity of computing the distortion for each memory depth of Form 1 terms may be reduced by recognizing that Eq. (21) may be re-written as:

$$x(l - m)\left[c_{1m} + c_{3m}|x(l - m)|^2 + c_{5m}|x(l - m)|^4 + c_{7m}|x(l - m)|^6\right] = \qquad \text{Eq. (22)}$$

$$x(l - m)L_m\left(|x(l - m)|^2\right)$$

In Eq. (22), $L_m(|x(l-m)|^2)$ is a polynomial in $|x(l-m)|^2$, whose coefficients are the values of c for the m-th memory depth. In Eqs. (21) and (22), the coefficients provided from the memory are $c_{1m}$, $c_{3m}$, $c_{5m}$, and $c_{7m}$. Furthermore, $L_m(|x(l-m)|^2)$ may be implemented as a Look-Up Table (LUT) indexed by the instantaneous power of sample x(l-m). In this form, the computational complexity of computing Eqs. (21) and (22) is advantageously reduced considerably.

Figure 3:
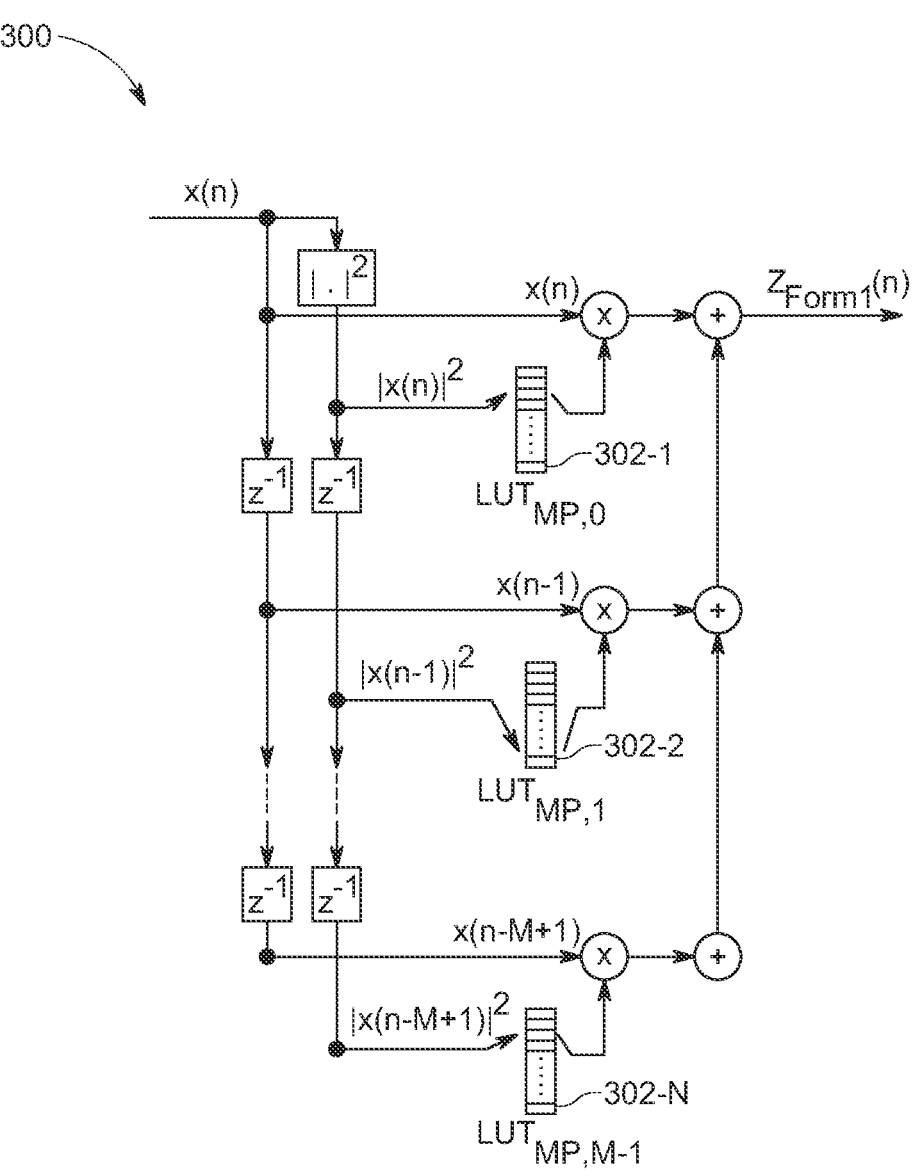
FIG. 3 is a schematic illustration of a memory polynomial look-up-table (LUT) digital pre-distortion element, in accordance with embodiments of the present disclosure.

FIG. 3 is a schematic illustration of a memory polynomial look-up-table (LUT) digital pre-distortion element, in accordance with embodiments of the present disclosure. FIG. 3 illustrates a Form 1 LUT pre-distortion structure 300 according to one or more embodiments. In the Form 1 structure, in one or more examples, two delay lines hold the values of the current and previous samples and magnitude squared values of the current and previous samples, respectively. Each LUT (302-1 to 302-n) may correspond to a different memory depth and may be indexed by the delayed magnitude squared of the sample and the LUT output multiplied by the delayed sample. For example, the LUT 302-1 (e.g., $LUT_{MP,0}$) may be indexed by the instantaneous power for the sample x(n). Similarly, the LUT 302-2 (e.g., $LUT_{MP,1}$) may be indexed by the instantaneous power for the sample x(n−1), and the LUT 302-N (e.g., $LUT_{MP,M-1}$) may be indexed by the instantaneous power for x(n−m+1). At each depth, the output may be according to Eq. (21). For example, the input x(n) is multiplied by the coefficients (e.g., $c_{1m}$, $c_{3m}$, etc. in Eq. (21)) from the LUT 302-1 indexed by $|x(n)|^2$. The delayed input x(n−1) is multiplied by the coefficients (e.g., $c_{1m}$, $c_{3m}$, etc. in Eq. (21)) from the LUT 302-1 indexed by $|x(n−1)|^2$. The $m^{th}$ delayed input x(n−M+1) is multiplied by the coefficients (e.g., $c_{1m}$, $c_{3m}$, etc. in Eq. (21)) from the LUT 302-1 indexed by $|x(n−M+1)|^2$. The sum across all delays (e.g., $Z_{Form1}(n)$) is the result of applying the memory polynomial to the input sample stream.

In DPD implementations, Form 2 and Form 3 terms are referred to as cross-terms since the computation of these terms involves the samples at different delays. Furthermore, the hardware implementation for Form 2 and Form 3 may be achieved through multipliers.

According to one or more embodiments, the cross-terms for Form 2 and Form 3 may be implemented using LUT structures. As discussed above, the cross-term may be a term where samples of different delays take part in forming the basis vector sample (e.g., $d_1 \neq d_2$). In one or more examples, Form 2 terms may be implemented as follows:

$$c_{2,d_1,d_2,p_1,p_2}x(n - d_1)^{p_1}|x(n - d_2)|^{p_2} = \qquad \text{Eq. (23)}$$

$$x(n - d_1)^{p_1}L_{2,d_1,d_2,p_1,p_2}\left(|x(n - d_2)|^2\right)$$

In Eq. 23, the input x(n) is delayed by two different delays $d_1$ and $d_2$. The coefficient $c_{2,d_1,d_2,p_1,p_2}$ may be retrieved from a LUT indexed by $|x(n−d_2)|^2$ (e.g., $L_{2,d_1,d_2,p_1,p_2}(|x(n−d_2)|^2)$).

In one or more examples, Form 3 terms may be implemented as follows:

$$c_{3,d_0,d_1,d_2,p_0,p_1,p_2} x(n-d_0)^{p_0} x(n-d_1)^{p_1} |x(n-d_2)|^{p_2} = \qquad \text{Eq. (24)}$$

$$x(n-d_0)^{p_0} x(n-d_1)^{p_1} L_{3,d_0,d_1,d_2,p_0,p_1,p_2}\left(|x(n-d_2)|^2\right)$$

In Eq. 24, the input x(n) is delayed by three different delays $d_0$, $d_1$, and $d_2$. The coefficient $c_{3,d_0,d_1,d_2,p_0,p_1,p_2}$ may be retrieved from a LUT indexed by $|x(n-d_2)|^2$ (e.g., $L_{3,d_0,d_1,d_2,p_0,p_1,p_2}(|x(n-d_2)|^2)$).

Figure 4:
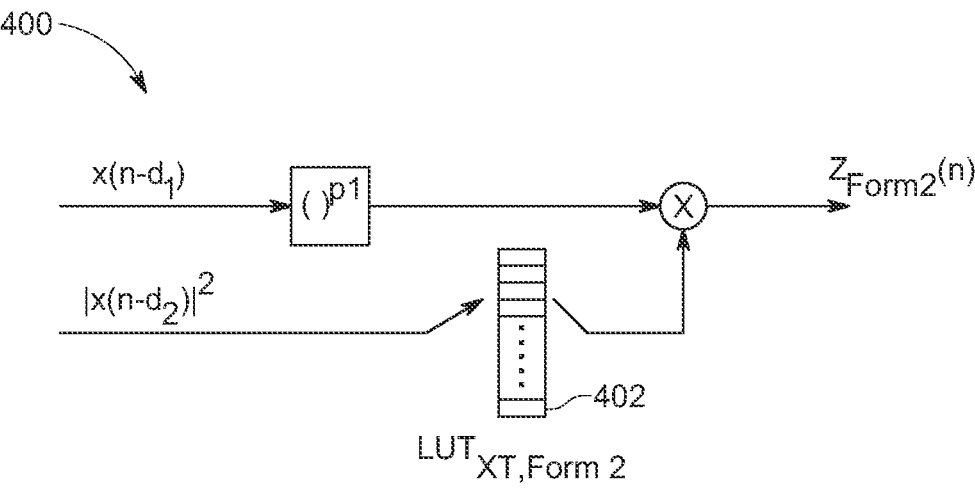
FIG. 4 is a schematic illustration of a two input cross-term LUT-based pre-distortion circuit, in accordance with embodiments of the present disclosure.

FIG. 4 is a schematic illustration of a two input cross-term LUT-based pre-distortion circuit, in accordance with embodiments of the present disclosure. FIG. 4 illustrates a Form 2 cross-term LUT-based pre-distortion structure 400 according to one or more embodiments. In one or more examples, the LUT-based pre-distortion structure 400 implements Eq. (23). As illustrated in FIG. 4, the structure 400 receives two versions of sample x(n) delayed by $d_1$ (e.g., $x(n-d_1)$) and $d_2$ (e.g., $x(n-d_2)$). The LUT 402 may be indexed by the instantaneous power for $x(n-d_2)$, where the LUT 402 outputs the coefficient $c_{2,d_1,d_2,p_1,p_2}$ from Eq. (23). The output of the structure 400 may be a multiplication of the output of the LUT 402 with a first exponential function $()^{p_1}$ applied to the sample $x(n-d_1)$.

Figure 5:
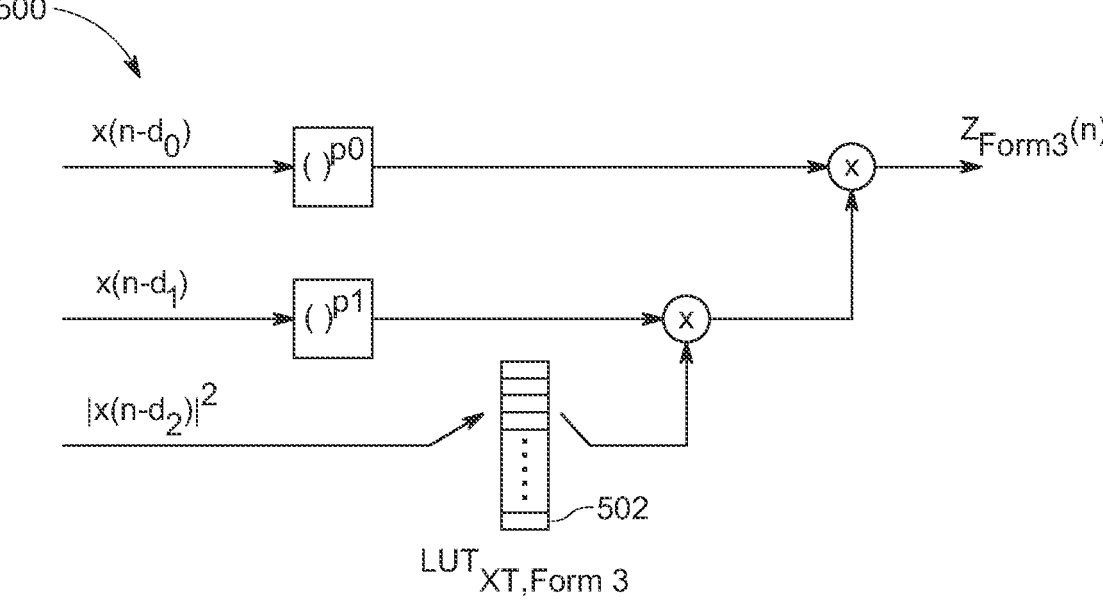
FIG. 5 is a schematic illustration of a three input cross-term LUT-based pre-distortion circuit, in accordance with embodiments of the present disclosure.

FIG. 5 is a schematic illustration of a three input cross-term LUT-based pre-distortion circuit, in accordance with embodiments of the present disclosure. FIG. 5 illustrates a Form 3 cross-term LUT-based pre-distortion structure 500 according to one or more embodiments. In one or more examples, the LUT-based pre-distortion structure 500 implements Eq. (24). As illustrated in FIG. 5, the structure 500 receives three versions of sample x(n) delayed by $d_0$, $d_1$, and $d_2$. The LUT 502 may be indexed by the instantaneous power for $x(n-d_2)$, where the LUT 502 outputs the coefficient $c_{3,d_0,d_1,d_2,p_0,p_1,p_2}$ from Eq. (24), The output of the structure 500 (e.g., $Z_{Form3}$) may be a multiplication of a second exponential function $()^{p_0}$ applied to the sample $x(n-d_0)$ with a multiplication of the output of the LUT 502 (e.g., $c_{3,d_0,d_1,d_2,p_0,p_1,p_2}$) with a first exponential function $()^{p_1}$ applied to the sample $x(n-d_1)$.

The implementation of the LUT structure according to the embodiments of the present disclosure for cross-terms enables a direct-to-LUT algorithm discussed in further detail below, and removes the constraint of a single coefficient for the cross-term across the whole dynamic range of the input signal, where the coefficient can, in principle, vary across the bins of the LUT.

In the example embodiments of Form 2 and Form 3, if $p_2$ is odd, the requirement to calculate a square root is moved from a high speed signal path to a processor that populates the LUT. In one or more examples, the output from the pre-distorter comprising structures 300, 400, and 500 may be the sum of Form 1, Form 2 and Form 3 terms:

$$z(n) = z_{Form1}(n) + z_{Form2}(n) + z_{Form3}(n) \qquad \text{Eq. (25)}$$

The sample-by-sample LMS update of the pre-distortion coefficients was described above for both the Indirect Learning (IL) scheme and the Closed-Loop Error Correction (CL-EC) scheme. For both of these schemes, the coefficients may be updated using the LMS algorithm of the pre-distorter on a sample-by-sample basis to iterate towards a solution that linearizes the PA. Both schemes operate by providing updates to the pre-distortion coefficients and therefore, for a LUT-based pre-distorter, an additional processing set may be implemented to calculate the LUT values from the coefficients (e.g., Eqs. (15), (16), and (17)). Furthermore, due to dynamic range considerations, the conventional LUT calculation may be better suited to a DSP processor. In a conventional LUT-based DPD implementation, a DSP is utilized for this purpose, which detracts from the advantage of the sample-by-sample approach, which was motivated by the need to simplify the processing sufficiently such that a DSP was not required.

According to one or more embodiments, a sample-by-sample update is provided directly to the LUTs. Based on the sample-by-sample update being provided directly to the LUTs, the step of calculating the coefficients of the pre-distorter and then computing the LUTs from the coefficients is removed. This solution lends itself to real-time low complexity high-speed hardware implementation and advantageously removes the need for the DSP.

In one or more examples, the equation for a memory polynomial for LUT-based post-distortion for the IL architecture (ignoring the cross-terms, which are handled in an identical manner) may be as follows:

$$\hat{z}(l) = \sum_{m=0}^{M-1} y(l-m) L_m\left(|y(l-m)|^2\right) \qquad \text{Eq. (26)}$$

The post-distorter may be applied to a group of M contiguous samples of the waveform y. An alternative view of this equation is that the LUT contents indexed by the M samples (e.g., via instantaneous sample power) act as linear weightings (e.g., coefficients) on the M samples before summation. Thus, in this interpretation, Eq. (10) may be re-defined as:

$$\text{Eq. (27)}$$

$$\hat{z}_{mp}(n) = c_{mp}^T(n) u_{mp}(n) = \left[L_0\left(|y(l)|^2\right)\right.$$

$$\left. L_1\left(|y(l-1)|^2\right) \ \ldots \ L_{M-1}\left(|y(l-(M-1))|^2\right)\right] \begin{bmatrix} y(l) \\ y(l-1) \\ \vdots \\ y(l-(M-1)) \end{bmatrix}$$

In this form, the LUT contents may take the role of the coefficients for a set of M contiguous samples having values that form the LUT indexes. Thus, the LMS algorithm may be applied where the LUT contents are indexed by the M contiguous samples.

In one or more examples, this formulation may be extended to include cross terms. For example, considering a single Form 2 term and a single Form 3 term:

$$\hat{z}_{ct}(n) = c_{ct}^T(n) u_{ct}(n) = \left[L_{2,d_1,d_2,p_1,p_2}\left(|y(n-d_2)|^2\right) \qquad \text{Eq. (28)}\right.$$

$$\left. L_{3,d_0,d_1,d_2,p_0,p_1,p_2}\left(|y(n-d_2)|^2\right)\right]\begin{bmatrix} y(n-d_1)^{p_1} \\ y(n-d_o)^{p_0} y(n-d_1)^{p_1} \end{bmatrix}$$

Combining the memory polynomial and cross-terms:

$$\hat{z}(n) = \begin{bmatrix} c_{mp}^T(n) & c_{ct}^T(n) \end{bmatrix}\begin{bmatrix} u_{mp}(n) \\ u_{ct}(n) \end{bmatrix} \qquad \text{Eq. (29)}$$

Since Eq. (27) takes exactly the same form as Eq. (10), it follows that exactly the formulation may be followed for a sample-by-sample LMS update:

$$\left[\, c_{mp}^T(n+1)\quad c_{ct}^T(n+1)\,\right]=\left[\, c_{mp}^T(n)\quad c_{ct}^T(n)\,\right]+$$
$$\mu e^*(n)[\, u_{mp}(n)\quad u_{ct}(n)\,]$$

<div align="right">Eq. 30</div>

From Eqs. (27) and (28), it can be seen that this equation (Eq. (30)) represents updates to the LUT bins of the memory and cross-terms LUTs address by the current samples, and therefore, enables a "direct-to-LUT" update, and advantageously removes the need to compute coefficients of the least squares problem and explicit calculation of the LUT.

Similarly, for a CL-EC architecture, computation of Eqs. (19) and (20) may be cast into the same form. As a result, the LUT updates for a CL-EC approach may also be re-cast as a direct-to-LUT sample-by-sample update.

The direct-to-LUT updates for either the IL or CL-EC architectures advantageously remove the heavy computational load required to compute the coefficients or calculate LUT contents from coefficients. Therefore, the direct-to-LUT approach advantageously removes the need for a DSP engine from the DPD system.

As discussed above, according to one or more embodiments, the LUT pre-distortion structure may be updated on a sample-by-sample basis, either for the IL or CL-EC architectures. In one or more examples, on each update, a single LUT bin of each LUT may be updated, where the particular bin is determined from the samples, either the PA output samples or the input waveform samples, for the IL or CL-EC architectures, respectively.

However, in one or more examples, it may be more efficient to take a small batch of samples (e.g., a batch smaller in number than the block update LS approach) and provide iterative updates to the LUT based on the sample batch. To maintain consistency between the LUT contents, observed error and basis vector, a single update to the LUTs may be provided for all batch samples while still utilizing the LMS update method.

In one or more examples, a system of L pre-distorting LUTs, the vector of bins indexed at time n is given by:

$$\mathcal{B}_n=\begin{bmatrix}b_0^n\\b_1^n\\\vdots\\b_{L-1}^n\end{bmatrix}$$

<div align="right">Eq. (31)</div>

In Eq. (31), $$0\le b_l^n<B_l,$$

where $B_l$ is the number of bins in the l'th LUT. Over the complete set of bin indices $\mathcal{B}=\{\mathcal{B}_0\;\mathcal{B}_1\cdots\mathcal{B}_{N-1}\}$, defines:

$$\mathcal{H}_l(b)=\mathcal{N}_\mathcal{B}(b_l^n=b)$$

<div align="right">Eq. (32)</div>

In one or more examples, as the number of times the $b^{th}$ bin of the $l^{th}$ LUT is indexed over the batch n=0 .... N−1 samples, the LUT update may be calculated as:

$$\Delta L_l(b)=\frac{1}{\mathcal{H}_l(b)}\sum\nolimits_{b_l^n=b}e^*(n)u_l(n)\quad\mathcal{H}_l(b)\ne0$$

<div align="right">Eq. (33)</div>

In one or more examples, the LUTs may be updated as:

$$L_l(b)=L_l(b)+\mu\Delta L_l(b)$$

<div align="right">Eq. (34)</div>

The method for sample-batch operation update based on Eqs. (33) and (34) may be complex since a count $\mathcal{H}_l(b)$ must be maintained, and then, the sum of the update contribution normalized as the count for each bin, as shown in Eq. (33).

For the case of the CL-EC algorithm, one or more embodiments for sample-batch update may be implemented as:

$$\left[\, c_{mp}^T(n+1)\quad c_{ct}^T(n+1)\,\right]=\left[\, c_{mp}^T(n)\quad c_{ct}^T(n)\,\right]+$$
$$\mu e'^*(n)[\, u_{mp}(n)\quad u_{ct}(n)\,]$$

<div align="right">Eq. (35)</div>

In Eq. (35), the modified error value may be defined as:

$$e'(n)=e(n)-\left[\, c_{mp}^T(n)\quad c_{ct}^T(n)\,\right][\, u_{mp}(n)\quad u_{ct}(n)\,]$$

<div align="right">Eq. (36)</div>

In one or more examples, in the CL-EC algorithm, based on the assumption that the PA's non-linearity may be linear over a small region (e.g., the update is based on a linear update to the coefficients to reduce the error), Eq. (36) takes this one step further. Based on the current state of the LUT, which was updated to reduce the error at a previous time, the next update should only reduce the residual error (or error of the error). When the PA is locally linear, the residual error may be calculated from Eq. (36) and the LUT update performed using this residual error value based on Eq. (35).

According to one or more embodiments, there are two modes of operation: (1) the update to the LUTs which form the pre-distorting structure is updated on a sample-by-sample basis, or (2) the LUTs are updated for a set of N samples (e.g., batch operation). In the sample-by-sample operation, for every input sample, an update is provided to the LUTs. The LUTs may be updated in-situ (e.g., within the pre-distorter) such that the next input sample is presented with the updated LUTs as a result of the previous sample. In this type of update, the processing of each sample, calculation of the LUT update and updating the LUTs is performed at the sample rate of the input waveform. Since the input sample rate of the digital pre-distorter may be 3 to 5 times the modulation bandwidth (in order to provide the bandwidth to support distortion products), very high-speed logic may be utilized to support the implementation of the sample-by-sample basis.

According to one or more embodiments, in the batch operation, a set of shadow LUTs may be constructed, which may be updated for a set of N input samples. When the N input samples are processed, the pre-distorting LUTs may be subsequently updated with the shadow LUTs. In one or more examples, the LUT smoothing stage may be required before the LUTs are updated in the pre-distorter. The batch mode operation therefore updates the LUTs on a sample-batch basis.

Figure 6:
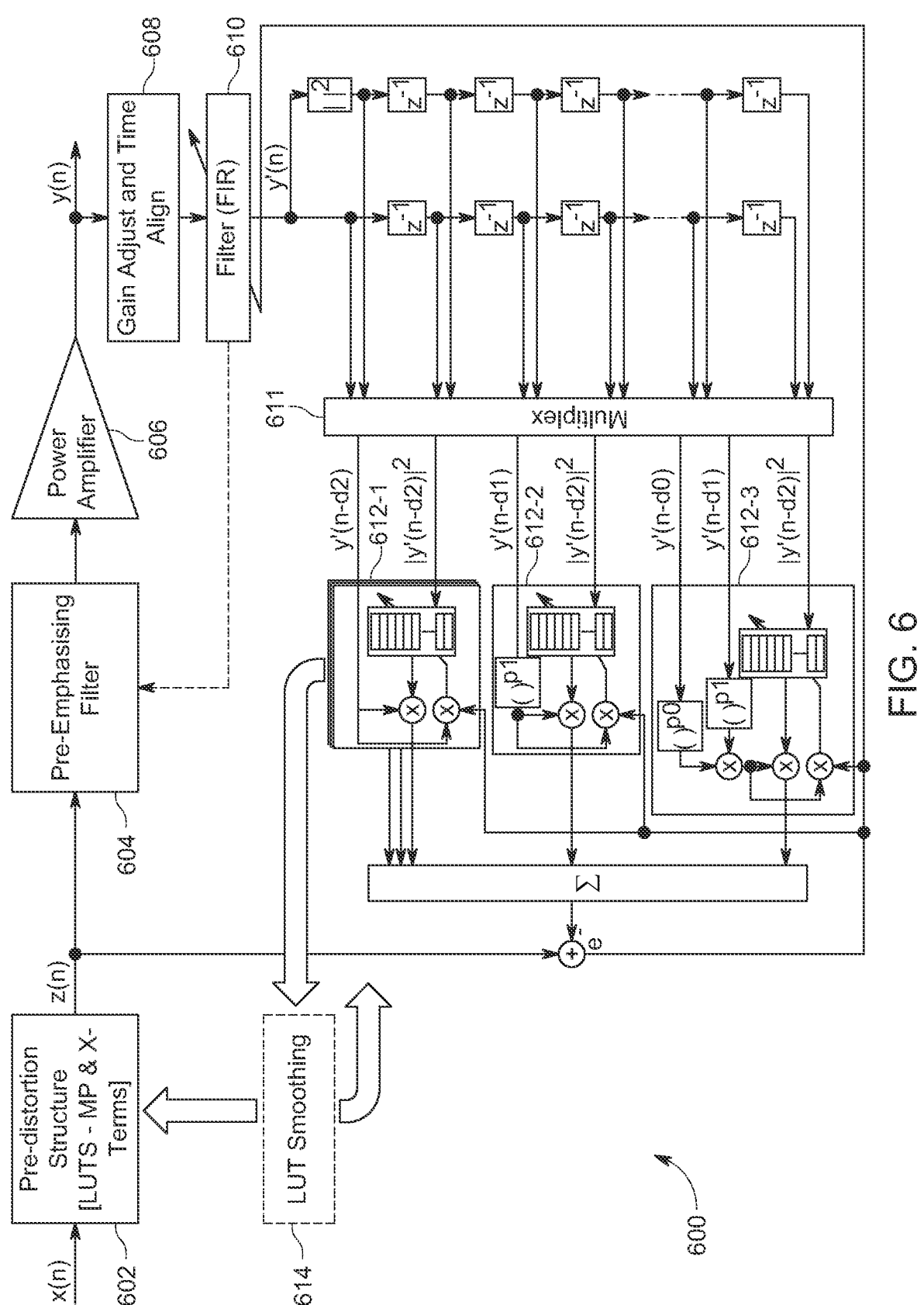
FIG. 6 is a schematic illustration of a system that implements an indirect learning algorithm with a LUT-based pre-distortion circuit trained using a direct-to-LUT algorithm, in accordance with embodiments of the present disclosure.

FIG. 6 is a schematic illustration of a system that implements an indirect learning (IL) algorithm with a LUT-based pre-distortion circuit trained using a direct-to-LUT algorithm, in accordance with embodiments of the present disclosure.

FIG. 6 illustrates a system 600 for the direct-to-LUT IL algorithm with a LUT-based pre-distorting structure trained using the direct-to-LUT algorithmic method described above, according to one or more embodiments. The system 600 may be a wireless transmitter that includes pre-distortion circuitry 602, a pre-emphasizing filter 604, a PA 606, a gain 608, a FIR filter 610, post-distortion circuitry (e.g., circuits 612-1, 612-2, and 612-3), and a LUT smoothing stage 614.

FIG. 6 illustrates a sample-batch mode of operation with an optional LUT smoothing stage 614 before LUT updates to the LUTs in the pre-distortion circuitry 602. For sample-by-sample mode the updated LUTs reside within the pre-distorting circuitry 602. The pre-distortion circuitry may be comprised of the Form 1 structure 300 (FIG. 3), the Form 2 structure 400 (FIG. 4), and the Form 3 structure 500 (FIG. 5) to produce the output z(n). However, as understood by one of ordinary skill in the art, the pre-distortion circuit may include one of the other following configurations (1) Form 1 only, (2) Form 1 and Form 2, (3) Form 1 and Form 3, (4) Form 2 only, (5) Form 2 and Form 3, or (5) Form 3 only.

As illustrated in FIG. 6, input samples x(n) pass through the pre-distortion circuitry 602, pre-emphasizing filter 604, and the PA 606 such that the output samples y(n) have the relationship:

$$y(n) = Gx(n) \qquad \text{Eq. 37}$$

When the pre-distorting circuitry 602 and pre-emphasizing filter 604 are correctly trained, G is the PA gain. In one or more examples, the role of the pre-emphasizing filter 604 is to flatten the linear gain of the forward path (e.g., remove gain and phase deviation from unity gain over the forward path passband). The pre-emphasizing filter 604 enables the distortion energy to be received at the PA with the same gain and phase created by the pre-distorting circuitry 602 and the samples y(n) taken at the output of the PA to be an accurate representation of the distortion added by the PA without additional effects that may interfere with the training procedure. The pre-emphasizing filter 604 may be configured based on a measurement of the forward path complex gain response.

In one or more examples, the Gain block 608 (e.g., 'Gain Adjust and Time Align') is configured to adjust the gain and timing of samples y(n) such that samples y(n) are aligned in gain and time with samples x(n). Gain and time aligned samples are filtered by an FIR filter, of M complex taps where M typically has value 3 or 5.

Samples of the output from the FIR filter y'(n) may be fed into a delay line of L delays. In parallel, the instantaneous power of the samples may be fed into a delay line of L delays. Samples move down the delay line as each new sample is received. The delay Line length L is sufficient to store the L previous samples required for training the pre-distorting structure.

FIG. 6 illustrates the Form 1, Form 2 and Form 3 LUT structures. Multiple Form 1 LUTs may be used and extend over the non-linear delay characteristics of the PA to be linearized. For brevity, only a single Form 1 LUT is explicitly shown (form 1 memory depth LUTs are implied in the figure). Multiple Form 2 and Form 3 LUTS may be used depending on the specific cross-term characteristics of the PA. For brevity, only a single Form 2 and Form 3 LUT are shown.

According to one or more embodiments, each form of the LUT, the delayed samples, and sample powers are output from the multiplexer 611, which accesses all possible samples and delayed samples from the delay lines.

The post-distortion circuitry may comprises circuits 612-1, 612-2, and 612-3. The circuit 612-1 may be a post-distortion circuit of Form 1 (300 of FIG. 3.). The circuit 612-2 may be a post-distortion circuit of Form 2 (400 of FIG. 4). The circuit 612-3 may be a post-distortion circuit of Form 3 (500 of FIG. 5).

FIG. 6 further includes an error calculation block 613. In one or more examples, at each time instance n, an error e (n) may be computed in the error calculation block 613, which is the difference between the output of the forward path pre-distorting circuitry 602 and the LUTs of the post-distortion circuitry being trained. The error sample e (n) may be used to update (e.g., train) the coefficients of the FIR filter according to the LMS update algorithm, and update the contents of the LUTs according to Eq. (30). In the sample-by-sample mode, the LUT is updated. In the sample-batch mode, the process of updating the FIR filter and LUTs continues until all samples in a batch have been processed.

Figure 7:
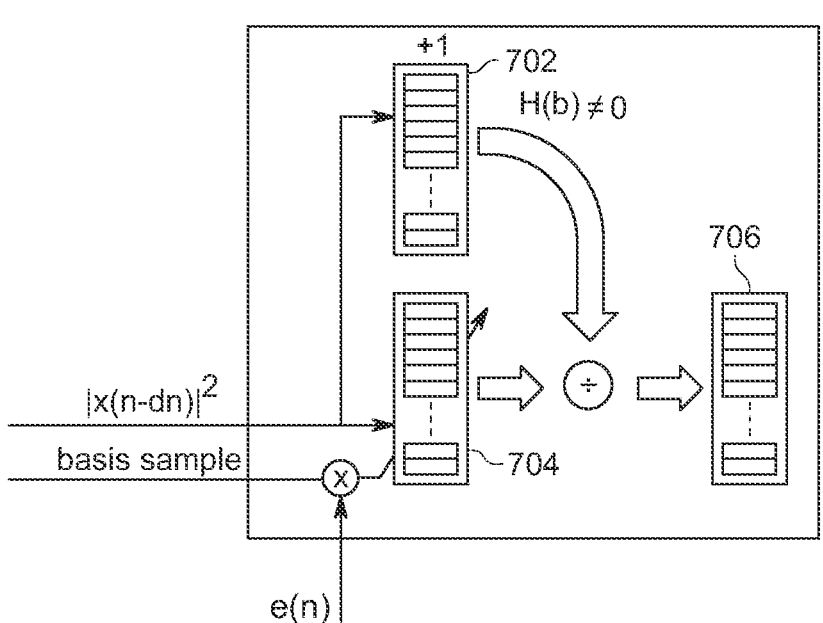
FIG. 7 is a schematic illustration of an LUT averaging circuit for sample-batch mode operation, in accordance with embodiments of the present disclosure.

FIG. 7 is a schematic illustration of an LUT averaging circuit for sample-batch mode operation, in accordance with embodiments of the present disclosure. FIG. 7 shows a circuit for the sample-batch mode where the averaged LUT is computed according to Eqs. (32) and (33). As illustrated in FIG. 7, the LUT 706 may be the average of shadow LUTs 702 and 704. Although two shadow LUTs are illustrated in FIG. 7, as understood by one of ordinary skill in the art, more than two shadow LUTs may be included. When operating in sample-batch mode, the LUTs illustrated in the embodiments of FIGS. 6 and 8 may include the embodiment of FIG. 7.

In one or more examples, for sample-batch mode, the shadow LUTs are optionally smoothed by the 'smoothing' block and the pre-distorting LUTs updated by the trained LUTs. Similarly, in one embodiment the pre-emphasizing FIR filter coefficients updated by the FIR filter coefficients. The training may be iterative for both sample-by-sample and sample-batch modes. The process may repeated until the LUTs have converged or sufficient linearization of the PA is achieved. For example, when e (n) is less than or equal to a threshold, the training iterations may be stopped. In another example, if the distortion energy from the PA is below a distortion threshold, the training iterations may be stopped.

Figure 8:
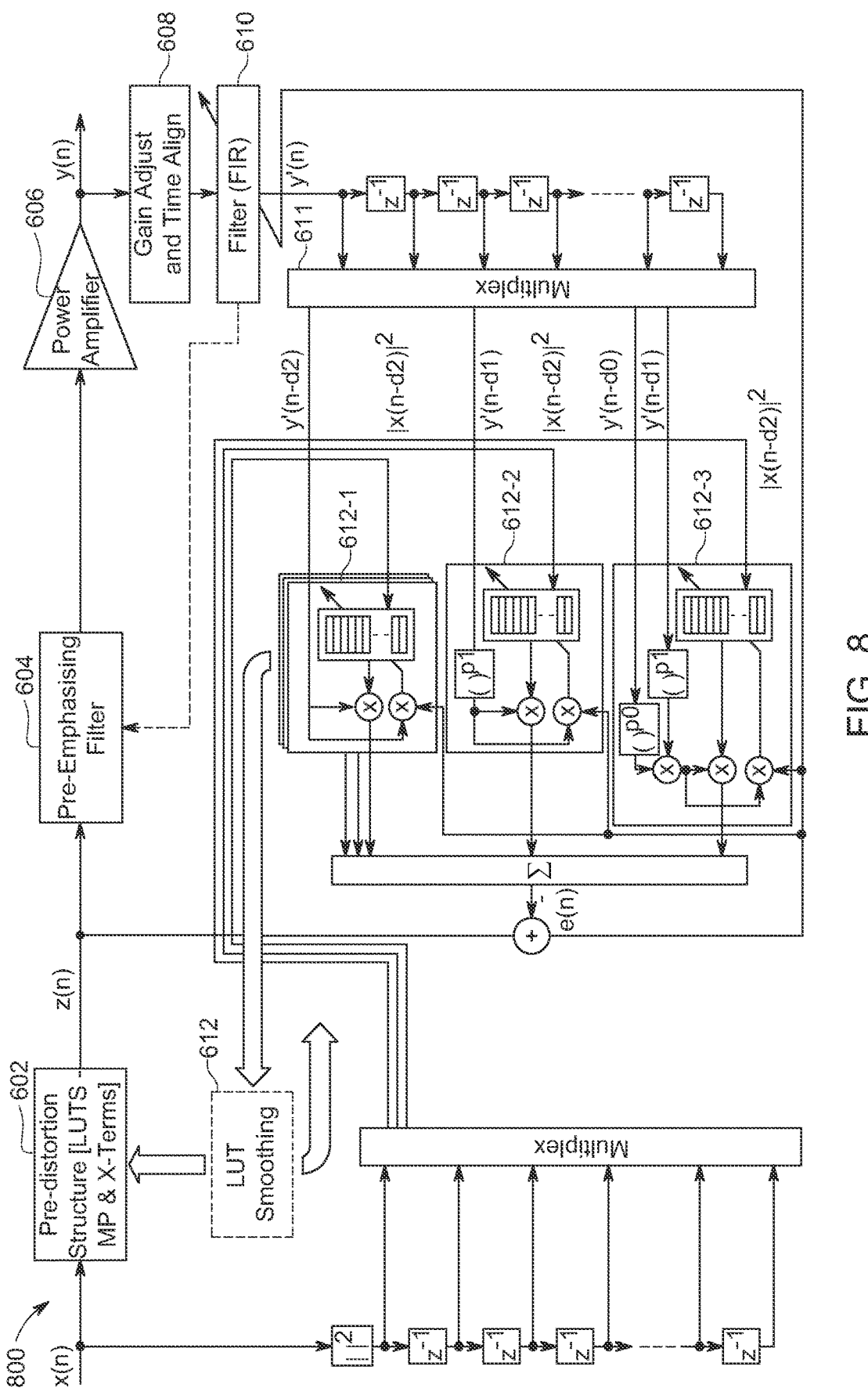
FIG. 8 is a schematic illustration of another system that implements an indirect learning algorithm with a LUT-based pre-distortion circuit trained using a direct-to-LUT algorithm, in accordance with embodiments of the present disclosure.

FIG. 8 is a schematic illustration of another system that implements an indirect learning algorithm with a LUT-based pre-distortion circuit trained using a direct-to-LUT algorithm, in accordance with embodiments of the present disclosure.

FIG. 8 shows an example system 800 for the direct-to-LUT indirect learning (IL) algorithm with a LUT-based pre-distorting structure trained using the direct-to-LUT algorithmic method described above, according to one or more embodiments. In the system 800, compared to the system 700, the indexing to the LUT is based upon the instantaneous power of the input samples. FIG. 8 shows the embodiment for the sample-batch mode. A set of shadow LUTs may be updated during the training mode. After each training iteration, the LUTs may be smoothed at the LUT smoothing stage 612 before the pre-distortion circuitry 612 is updated and the smoothed LUTs re-written to the shadow LUTs.

Figure 9:
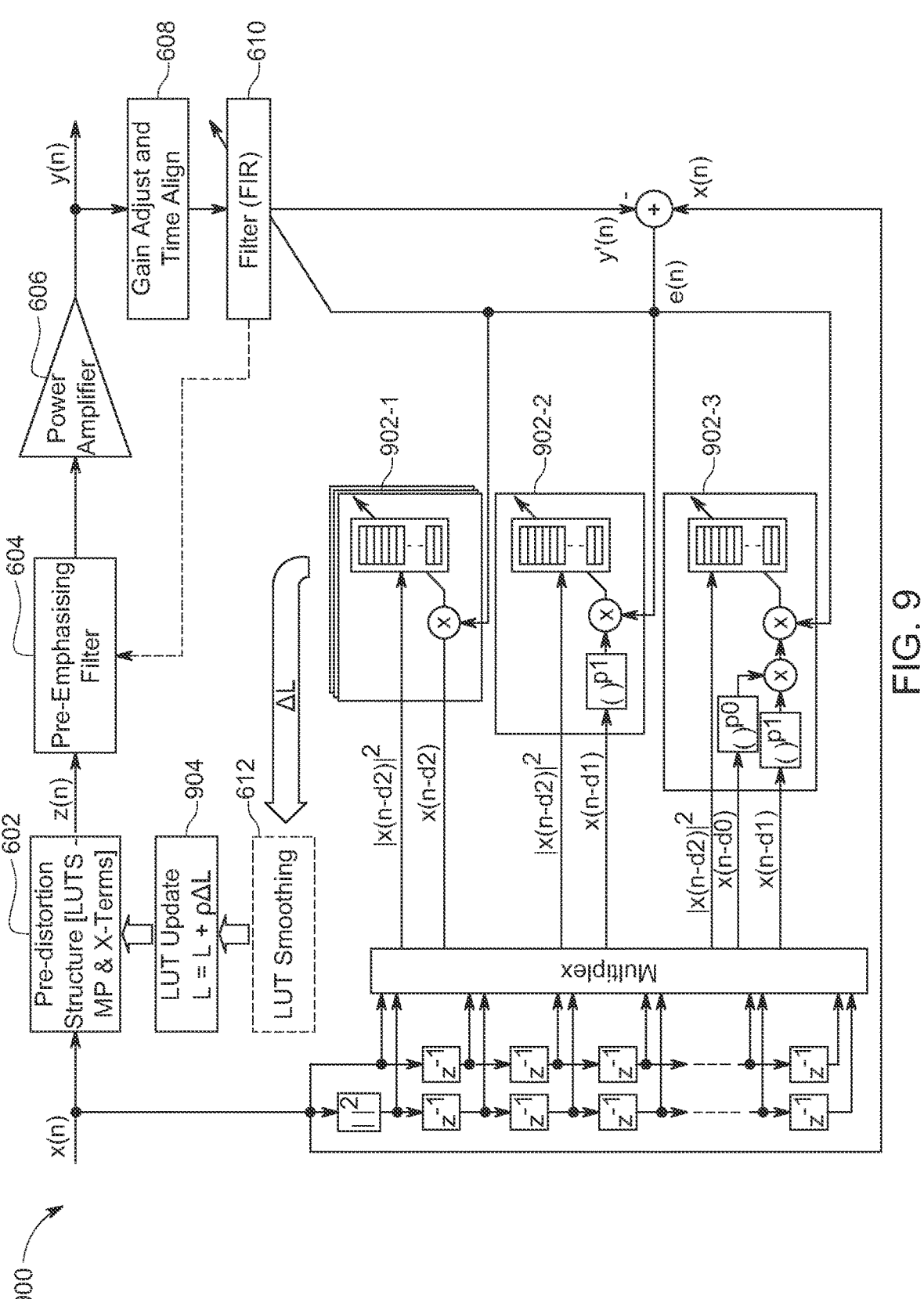
FIG. 9 is a schematic illustration of a system that implements a Closed-Loop-Error-Correcting Algorithm with a LUT-based pre-distortion circuit trained using a direct-to-LUT algorithm, in accordance with embodiments of the present disclosure.

FIG. 9 is a schematic illustration of a system that implements a CL-EC with a LUT-based pre-distortion circuit trained using a direct-to-LUT algorithm, in accordance with embodiments of the present disclosure.

FIG. 9 illustrates a system 900 for a direct-to-LUT training CL-EC algorithm with a LUT-based pre-distorting structure, according to one or more embodiments. The system 900 may include the pre-distortion circuitry 602, pre-emphasizing filter 604, the PA 606, the Gain 608, and the FIR filter 610 of system 600.

In system 900, the input to the delay lines may be the input samples and the power of the input samples. The system 900 may include post-distortion circuitry that comprises circuit 902-1, circuit 902-2, and circuit 902-3. Circuit 902-1 may be a post-distortion circuit of Form 1 (300 of FIG. 3). Circuit 902-2 may be a post-distortion circuit of Form 2 (400 of FIG. 4). Circuity 902-3 may be a post-distortion circuit of Form 3 (500 of FIG. 5). Inputs to the Form 1, 2, and 3 LUTs may be derived from these samples. An error e (n) may be computed between the FIR filter output and the input sample. The direct-to-LUT CL-EC algorithm may compute the change in the LUT required to drive the error signal to zero. The system 900 may further include an additional LUT update stage 904. The system 900 may further include an error calculation block 906 that computes an error e (n) based on the output y(n) and the input x(n).

Figure 10:
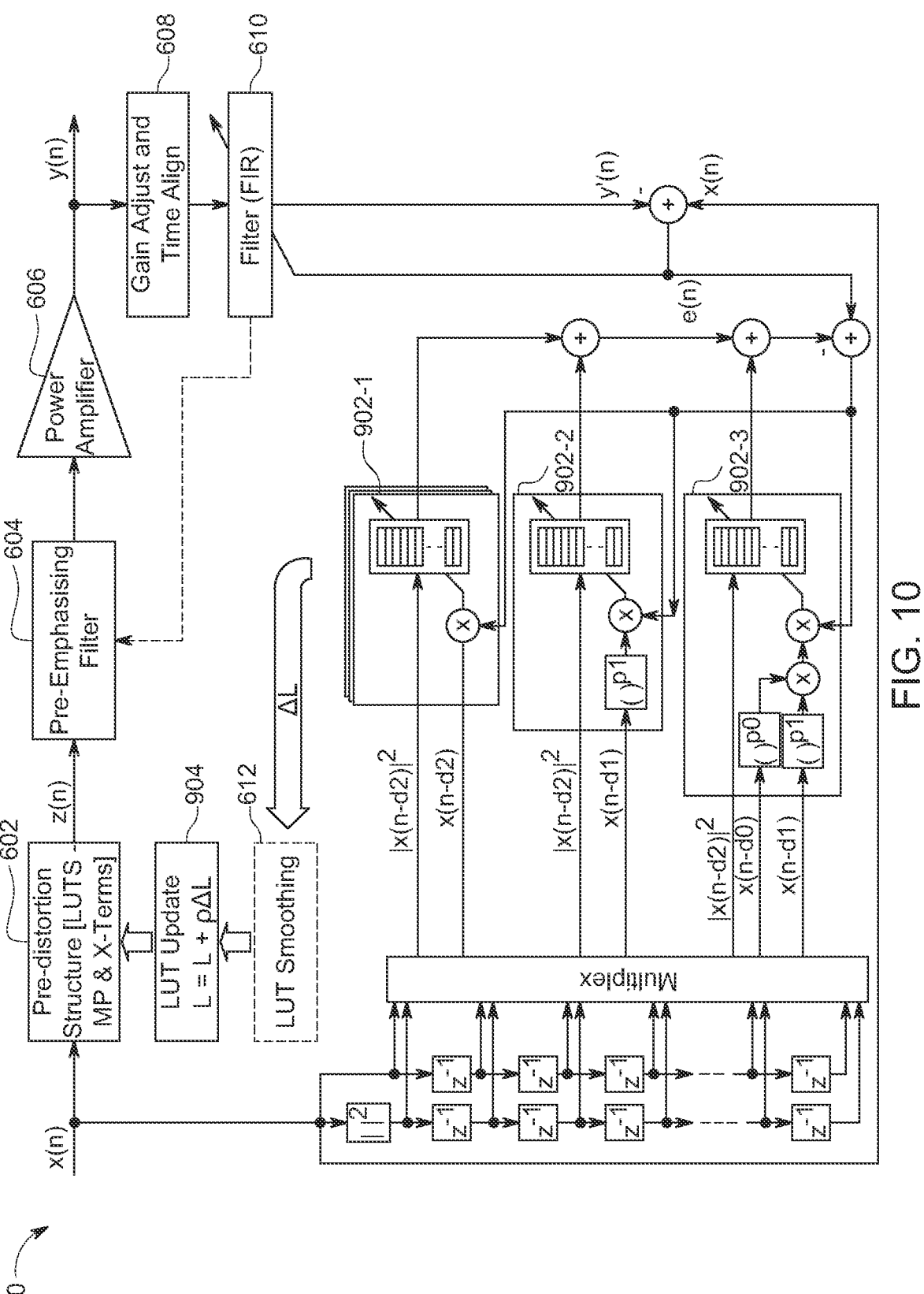
FIG. 10 is a schematic illustration of another system that implements a Closed-Loop-Error-Correcting Algorithm with a LUT-based pre-distortion circuit trained using a direct-to-LUT algorithm, in accordance with embodiments of the present disclosure.

FIG. 10 is a schematic illustration of another system that implements a CL-EC Algorithm with a LUT-based pre-distortion circuit trained using a direct-to-LUT algorithm, in accordance with embodiments of the present disclosure.

FIG. 10 illustrates a system 1000 for the CL-EC algorithm with a LUT-based pre-distorting structure trained using the direct-to-LUT update algorithm for sample-batch processing, according to one or more embodiments. In the system 1000, the LUT averaging processing is removed (e.g., FIG. 7) for each LUT update block, and an additional error computation stage introduced, such that the update algorithm is driven by the "error-of-the-error" and the update to the shadow LUTs are made on a sample-by-sample basis. The update to the pre-distorting LUTs remains after the complete batch of samples in processed, which maintains an overall sample-batch update.

Figure 11:
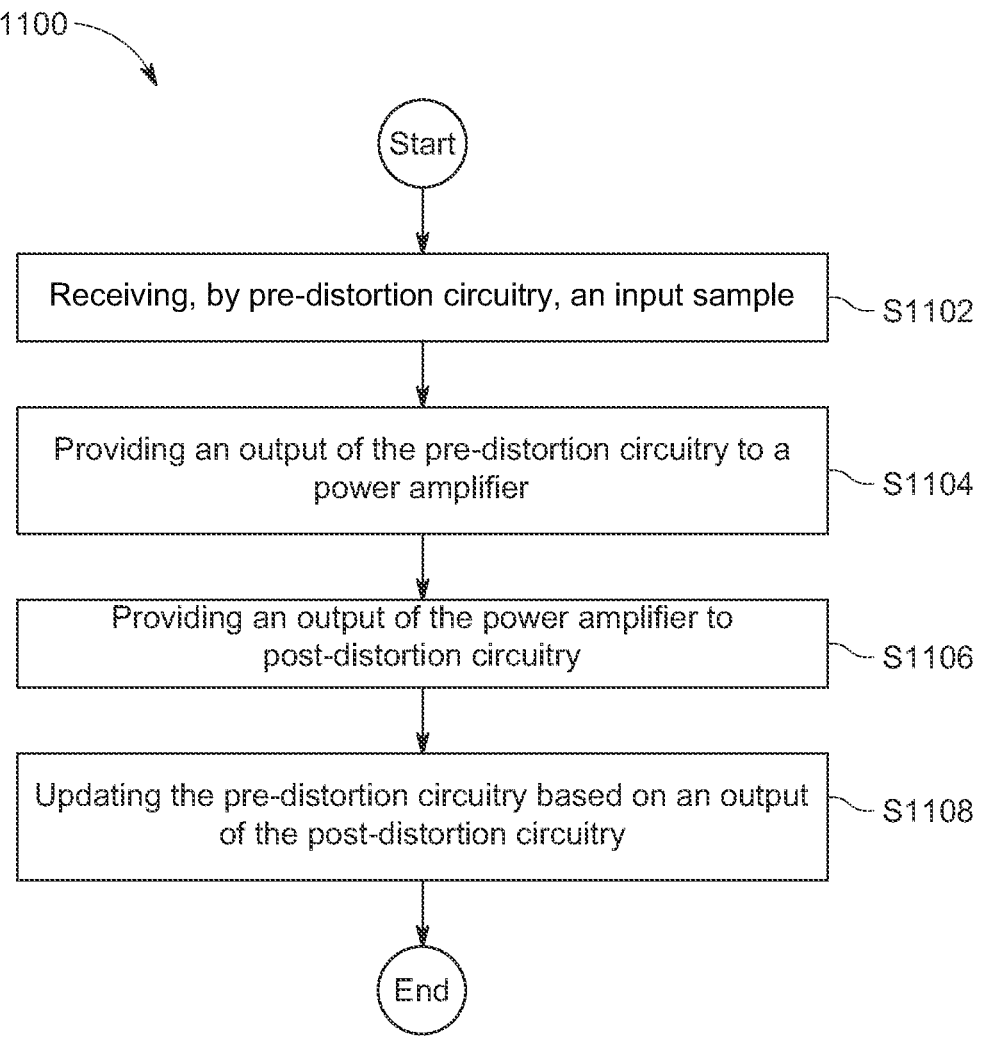
FIG. 11 is a flow chart of an example distortion method for a power amplifier, in accordance with embodiments of the present disclosure.

FIG. 11 is a flow chart of an example distortion method for a power amplifier, in accordance with embodiments of the present disclosure. FIG. 11 illustrates an example process 1100 for implementing a distortion method for a power amplifier. The process may start at operation 1102 where an input sample is received by pre-distortion circuitry. The pre-distortion circuitry may comprise the Form 1 pre-distortion circuit 300 (FIG. 3), the Form 2 cross-term LUT circuit 400 (FIG. 4), and the Form 3 cross-term LUT circuit 500 (FIG. 5).

The process proceeds to operation 1104 where an output of the pre-distortion circuitry (e.g., Z (n)) is provided to a power amplifier such as power amplifier 606 (FIG. 6). The process proceeds to operation 1106 where an output of the power amplifier is provided to post-distortion circuitry. The post-distortion circuitry may correspond to the post-distortion circuitry of FIGS. 6 and 8 (612-1, 612-2, 612-3) or the post-distortion circuitry of FIGS. 9 and 10 (902-1, 902-2, 902-3).

The process proceeds to operation 1108 where the pre-distortion circuitry is updated based on an output of the post-distortion circuitry. For example, the pre-distortion circuitry may be updated according to the post-distortion circuitry of FIGS. 6 and 8 (612-1, 612-2, 612-3) or the post-distortion circuitry of FIGS. 9 and 10 (902-1, 902-2, 902-3).

According to the embodiments of the present disclosure, a direct LUT update on a sample-by-sample or batch-sample basis removing the need for an external DSP processor may be implemented. Furthermore, the cross-term and LUTs, which allows an identical algorithm to provide updates to all forms of basis functions may be implemented. Furthermore, training of pre-distortion LUTs and FIR filter may be simultaneously performed. Additionally, the operation may be performed in sample-by-sample or sample-batch modes.

The embodiments have been described above and illustrated in terms of blocks, as shown in the drawings, which carry out the described function or functions. These blocks may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein). The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

While this disclosure has described several non-limiting embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

The above disclosure also encompasses the embodiments listed below:

(1) A distortion apparatus for a power amplifier, the distortion apparatus comprising: pre-distortion circuitry that comprises a memory polynomial look-up-table (LUT) circuit; and post-distortion circuitry that updates the pre-distortion circuitry based on an output of the power amplifier, in which the pre-distortion circuitry comprises a plurality of LUTs, in which each LUT corresponds to a different memory depth of a memory polynomial of a Volterra series, in which each LUT indexed by an instantaneous power of an input sample delayed by an amount corresponds to a respective memory depth of each LUT, in which an output of the memory polynomial LUT circuit corresponds to a summation of an output of each LUT multiplied by the input sample delayed by the amount corresponding to the respective memory depth of each LUT, and an output of the pre-distortion circuitry is provided to the power amplifier.

(1) A distortion apparatus for a power amplifier, the distortion apparatus comprising: pre-distortion circuitry that comprises a memory polynomial circuit; and post-distortion circuitry that is configured to update the pre-distortion circuitry based on an output of the power amplifier, wherein the memory polynomial circuit comprises a plurality of LUTs, wherein each LUT of the memory polynomial circuit corresponds to a different memory depth of a memory polynomial of a Volterra series, wherein each LUT is indexed by an instantaneous power of an input sample delayed by an amount that corresponds to a respective memory depth of each LUT, wherein an output of the memory polynomial circuit corresponds to a summation of a coefficient output from each LUT multiplied by the input sample delayed by the amount corresponding to the respective memory depth of each LUT, and wherein an output of the pre-distortion circuitry is provided to the power amplifier.

(2) The distortion apparatus according to feature (1), in which the pre-distortion circuitry comprises: a first cross-term circuit that comprises at least one LUT and is configured to receive a first delayed version of the input sample and a second delayed version of the input sample delayed by a different amount than the first delayed version of the input sample, in which the at least one LUT is indexed based on an instantaneous power of the second delayed version of the input sample, and in which an output of the first cross-term circuit corresponds to a multiplication of (i) a first exponential function applied to the first delayed version of the input sample with (ii) a coefficient output from the at least one LUT.

(3) The distortion apparatus according to feature (2), in which the pre-distortion circuitry comprises: a second cross-term circuit that comprises at least one LUT and is configured to receive the first delayed version of the input sample, the second delayed version of the input sample, and a third delayed version of the input sample that is delayed by a different amount than first delayed version of the input sample and the second delayed version of the input sample, in which the at least one LUT is indexed based on the instantaneous power of the second delayed version of the input sample, and in which an output of the second cross-term circuit corresponds to a multiplication of (i) a second exponential function applied to the second delayed version of the input sample with (ii) a multiplication of the first exponential function applied to the first delayed version of the input sample with a coefficient output from the at least one LUT.

(4) The distortion apparatus according to feature (3), in which the output of the pre-distortion circuitry corresponds to a summation of the output of the memory polynomial LUT, the output of the first cross-term circuit, and the output of the second cross-term circuit.

(5) The distortion apparatus according to feature (3), in which the post-distortion circuit comprises: a post-distortion memory polynomial LUT circuit that comprises a plurality of LUTs, in which each LUT of the post-distortion memory polynomial circuit corresponds to a different memory depth of the memory polynomial of the volterra series, in which each LUT of the post-distortion memory polynomial circuit is indexed by one of (i) an instantaneous power of an output sample from the power amplifier delayed by an amount corresponding to a respective memory depth of each LUT and (ii) the instantaneous power of an input sample delayed by an amount corresponding to the respective memory depth of each LUT, and in which an output of the post-distortion memory polynomial LUT circuit corresponds to a summation of a coefficient output from each LUT multiplied by the output sample of the power amplifier delayed by the amount corresponding to the respective memory depth of each LUT.

(6) The distortion apparatus according to feature (5), in which the post-distortion circuit comprises: a post-distortion first cross-term circuit that includes at least one LUT and is configured to receive a first delayed version of the output sample from the power amplifier and a second delayed version of the output sample from the power amplifier delayed by a different amount than the first delayed version of the output sample, in which the at least one LUT of the post-distortion first cross-term circuit is indexed based on one of (i) an instantaneous power of the second delayed version of the output sample from the power amplifier or (ii) the instantaneous power of the input sample, and in which an output of the post-distortion first cross-term circuit corresponds to a multiplication (i) the first exponential function applied to the first delayed version of the output sample from the power amplifier with (ii) a coefficient output from the at least one LUT.

(7) The distortion apparatus of according to feature (6), in which the pre-distortion circuitry comprises: a post-distortion second cross-term circuit that includes at least one LUT and is configured to receive: the first delayed version of the output sample from the power amplifier; the second delayed version of the output sample from the power amplifier; and a third delayed version of the output sample from the power amplifier delayed by a different amount than the first delayed version of the output sample and the second delayed version of the output sample, in which the at least one LUT of the post-distortion second cross-term circuit is indexed based on one of (i) the instantaneous power of the second delayed version of the output sample from the power amplifier and (ii) the instantaneous power of the input sample, and in which an output of the post-distortion second cross-term circuit corresponds to a multiplication of (i) a second exponential function applied to the second delayed version of the output sample from the power amplifier with (ii) a multiplication of the first exponential function applied to the first delayed version of the output sample from the power amplifier with a coefficient output from the at least one LUT.

(8) The distortion apparatus of feature (7), further comprising an error calculation block configured to compute an error based on a difference between (i) a sum of the post-distortion memory polynomial LUT circuit, (ii) the post-distortion first cross-term circuit, and the post-distortion second cross-term circuit and (iii) the output of the pre-distortion circuitry, in which the post-distortion circuitry is configured to update each LUT based on the computed error.

(9) The distortion apparatus of feature (8), in which the post-distortion circuitry is configured to update each LUT based on the computed error on a sample by sample basis.

(10) The distortion apparatus of feature (9), in which the post-distortion circuitry is configured to update each LUT based on the computed error on a batch of samples.

(11) The distortion apparatus of any one of features (3)-(10), in which the post-distortion circuitry comprises: a post-distortion memory polynomial LUT circuit that comprises a plurality of LUTs, each LUT corresponding to the different memory depth of the memory polynomial of the Volterra series, each LUT indexed by the instantaneous power of the second delayed version of the input sample, a post-distortion first cross-term circuit that comprises at least one LUT that is indexed by the instantaneous power of the second delayed version of the input sample, a post-distortion second cross-term circuit that includes at least one LUT that is indexed by the instantaneous power of the second delayed version of the input sample.

(12) The distortion apparatus of feature (11), further comprising an error calculation block configured to compute an error based on a difference between the output of the power amplifier and the input sample.

(13) The distortion apparatus of feature (12), in which the post-distortion circuitry is configured to update each LUT of the post-distortion memory polynomial LUT circuit based on a multiplication of the computed error with the second delayed version of the input sample.

(14) The distortion apparatus of feature (12), in which the post-distortion circuitry is configured to update the at least one LUT of the post-distortion first cross-term circuit based on a multiplication of the computed error with the first exponential function applied to the first delayed version of the input sample.

(15) The distortion apparatus of feature (12), in which the post-distortion circuitry is configured to update the at least one LUT of the post-distortion second cross-term circuit based on a multiplication of the computed error with a multiplication of (a) the first exponential function applied to the first delayed version of the input sample with (b) the second exponential function applied to the third delayed version of the input sample.

(16) The distortion apparatus of feature (15), in which the post-distortion circuitry is configured to update each LUT in the post-distortion circuitry based on the computed error on a sample by sample basis.

(17) The distortion apparatus of feature (15), in which the post-distortion circuitry is configured to update each LUT in the post-distortion circuitry based on the computed error on a batch of samples.

(18) The distortion apparatus of any one of features (1)-(17), further comprising a Finite Impulse Response (FIR) filter that is configured to receive the output of the power amplifier and provide one or more inputs to the post-distortion circuitry.

(19) A distortion apparatus for a power amplifier, the distortion apparatus comprising: pre-distortion circuitry that comprises a cross-term circuit; and post-distortion circuitry that updates the pre-distortion circuitry based on an output of the power amplifier, in which the cross-term circuit comprises at least one LUT and is configured to receive a first delayed version of an input sample and a second delayed version of the input sample delayed by a different amount than the first delayed version of the input sample, in which the at least one LUT is indexed based on an instantaneous power of the second delayed version of the input sample, and in which an output of the first cross-term circuit corresponds to a multiplication of (i) a first exponential function applied to the first delayed version of the input sample with (ii) a coefficient output from the at least one LUT.

(20) A distortion apparatus for a power amplifier, the distortion apparatus comprising: pre-distortion circuitry that comprises a cross-term circuit; and post-distortion circuitry that updates the pre-distortion circuitry based on an output of the power amplifier, in which the cross-term circuit comprises at least one LUT and is configured to receive the first delayed version of the input sample, a second delayed version of the input sample, and a third delayed version of the input sample that is delayed by a different amount than first delayed version of the input sample and the second delayed version of the input sample, in which the at least one LUT is indexed based on the instantaneous power of the second delayed version of the input sample, and in which an output of the second cross-term circuit corresponds to a multiplication of (i) a second exponential function applied to the second delayed version of the input sample with (ii) a multiplication of the first exponential function applied to the first delayed version of the input sample with a coefficient output from the at least one LUT.

What is claimed is:

1. A distortion apparatus for a power amplifier, the distortion apparatus comprising:

pre-distortion circuitry that comprises a memory polynomial circuit;

post-distortion circuitry that is configured to update the pre-distortion circuitry based on an output of the power amplifier; and a Finite Impulse Response (FIR) filter that is configured to receive the output of the power amplifier and provide one or more inputs to the post-distortion circuitry, wherein the memory polynomial circuit comprises a plurality of LUTs, wherein each LUT of the memory polynomial circuit corresponds to a different memory depth of a memory polynomial of a Volterra series, wherein an instantaneous power of an input sample delayed by an amount that corresponds to a respective memory depth of each LUT is obtained by squaring an absolute value of the input sample delayed by the amount, wherein each LUT is indexed by the instantaneous power of the input sample delayed by the amount that corresponds to the respective memory depth of each LUT, wherein an output of the memory polynomial circuit corresponds to a summation of a coefficient output from each LUT multiplied by the input sample delayed by the amount corresponding to the respective memory depth of each LUT, and wherein an output of the pre-distortion circuitry is provided to the power amplifier, and wherein each LUT and coefficients of the FIR filter are updated together.

2. The distortion apparatus according to claim 1, wherein the pre-distortion circuitry comprises:

a first cross-term circuit that comprises at least one LUT and is configured to receive a first delayed version of the input sample and a second delayed version of the input sample delayed by a different amount than the first delayed version of the input sample, wherein the at least one LUT is indexed based on an instantaneous power of the second delayed version of the input sample, and wherein an output of the first cross-term circuit corresponds to a multiplication of (i) a first exponential function applied to the first delayed version of the input sample with (ii) a coefficient output from the at least one LUT.

3. The distortion apparatus according to claim 2, wherein the pre-distortion circuitry comprises:

a second cross-term circuit that comprises at least one LUT and is configured to receive the first delayed version of the input sample, the second delayed version of the input sample, and a third delayed version of the input sample that is delayed by a different amount than the first delayed version of the input sample and the second delayed version of the input sample, wherein the at least one LUT is indexed based on the instantaneous power of the second delayed version of the input sample, and wherein an output of the second cross-term circuit corresponds to a multiplication of (i) a second exponential function applied to the second delayed version of the input sample with (ii) a multiplication of the first exponential function applied to the first delayed version of the input sample with a coefficient output from the at least one LUT.

4. The distortion apparatus according to claim 3, wherein the output of the pre-distortion circuitry corresponds to a summation of the output of the memory polynomial, the output of the first cross-term circuit, and the output of the second cross-term circuit.

5. The distortion apparatus according to claim 3, wherein the post-distortion circuitry comprises:

a post-distortion memory polynomial circuit that comprises a plurality of LUTs, wherein each LUT of the post-distortion memory polynomial circuit corresponds to a different memory depth of the memory polynomial of the Volterra series, wherein each LUT of the post-distortion memory polynomial circuit is indexed by one of (i) an instantaneous power of an output sample from the power amplifier delayed by an amount corresponding to a respective memory depth of each LUT and (ii) the instantaneous power of the input sample delayed by an amount corresponding to the respective memory depth of each LUT, and wherein an output of the post-distortion memory polynomial circuit corresponds to a summation of a coefficient output from each LUT multiplied by the output sample of the power amplifier delayed by the amount corresponding to the respective memory depth of each LUT.

6. The distortion apparatus according to claim 5, wherein the post-distortion circuitry comprises:

a post-distortion first cross-term circuit that includes at least one LUT and is configured to receive the first delayed version of the output sample from the power amplifier and a second delayed version of the output sample from the power amplifier delayed by a different amount than the first delayed version of the output sample, wherein the at least one LUT of the post-distortion first cross-term circuit is indexed based on one of (i) an instantaneous power of the second delayed version of the output sample from the power amplifier or (ii) the instantaneous power of the input sample, and wherein an output of the post-distortion first cross-term circuit corresponds to a multiplication of (i) the first exponential function applied to the first delayed version of the output sample from the power amplifier with (ii) a coefficient output from the at least one LUT.

7. The distortion apparatus according to claim 6, wherein the pre-distortion circuitry comprises:

a post-distortion second cross-term circuit that includes at least one LUT and is configured to receive:

the first delayed version of the output sample from the power amplifier;

the second delayed version of the output sample from the power amplifier; and a third delayed version of the output sample from the power amplifier delayed by a different amount than the first delayed version of the output sample and the second delayed version of the output sample, wherein the at least one LUT of the post-distortion second cross-term circuit is indexed based on one of (i) the instantaneous power of the second delayed version of the output sample from the power amplifier and (ii) the instantaneous power of the input sample, and wherein an output of the post-distortion second cross-term circuit corresponds to a multiplication of (i) a second exponential function applied to the second delayed version of the output sample from the power amplifier with (ii) a multiplication of the first exponential function applied to the first delayed version of the output sample from the power amplifier with a coefficient output from the at least one LUT.

8. The distortion apparatus of claim 7, further comprising an error calculation block configured to compute an error based on a difference between (i) a sum of the post-distortion memory polynomial circuit, (ii) the post-distortion first cross-term circuit, and the post-distortion second cross-term circuit and (iii) the output of the pre-distortion circuitry, wherein the post-distortion circuitry is configured to update each LUT based on the computed error.

9. The distortion apparatus of claim 8, wherein the post-distortion circuitry is configured to update each LUT based on the computed error on a sample by sample basis.

10. The distortion apparatus of claim 9, wherein the post-distortion circuitry is configured to update each LUT based on the computed error on a batch of samples.

11. The distortion apparatus of claim 3, wherein the post-distortion circuitry comprises:

a post-distortion memory polynomial circuit that comprises a plurality of LUTs, each LUT corresponding to a different memory depth of the memory polynomial of the Volterra series, each LUT indexed by the instantaneous power of the second delayed version of the input sample;

a post-distortion first cross-term circuit that comprises at least one LUT that is indexed by the instantaneous power of the second delayed version of the input sample; and a post-distortion second cross-term circuit that comprises at least one LUT that is indexed by the instantaneous power of the second delayed version of the input sample.

12. The distortion apparatus of claim 11, further comprising an error calculation block configured to compute an error based on a difference between the output of the power amplifier and the input sample.

13. The distortion apparatus of claim 12, wherein the post-distortion circuitry is configured to update each LUT of the post-distortion memory polynomial circuit based on a multiplication of the computed error with the second delayed version of the input sample.

14. The distortion apparatus of claim 12, wherein the post-distortion circuitry is configured to update the at least one LUT of the post-distortion first cross-term circuit based on a multiplication of the computed error with the first exponential function applied to the first delayed version of the input sample.

15. The distortion apparatus of claim 12, wherein the post-distortion circuitry is configured to update the at least one LUT of the post-distortion second cross-term circuit based on a multiplication of the computed error with a multiplication of (a) the first exponential function applied to the first delayed version of the input sample with (b) the second exponential function applied to the third delayed version of the input sample.

16. The distortion apparatus of claim 15, wherein the post-distortion circuitry is configured to update each LUT in the post-distortion circuitry based on the computed error on a sample by sample basis.

17. The distortion apparatus of claim 15, wherein the post-distortion circuitry is configured to update each LUT in the post-distortion circuitry based on the computed error on a batch of samples.

18. A distortion apparatus for a power amplifier, the distortion apparatus comprising:

pre-distortion circuitry that comprises a cross-term circuit;

post-distortion circuitry that updates the pre-distortion circuitry based on an output of the power amplifier; and a Finite Impulse Response (FIR) filter that is configured to receive the output of the power amplifier and provide one or more inputs to the post-distortion circuitry, wherein the cross-term circuit comprises at least one LUT and is configured to receive a first delayed version of an input sample and a second delayed version of the input sample delayed by a different amount than the first delayed version of the input sample, wherein an instantaneous power of the second delayed version of the input sample is obtained by squaring an absolute value of the second delayed version of the input sample, wherein the at least one LUT is indexed based on the instantaneous power of the second delayed version of the input sample, wherein an output of the cross-term circuit corresponds to a multiplication of (i) a first exponential function applied to the first delayed version of the input sample with (ii) a coefficient output from the at least one LUT, and wherein each LUT and coefficients of the FIR filter are updated together.

19. A distortion apparatus for a power amplifier, the distortion apparatus comprising:

pre-distortion circuitry that comprises a cross-term circuit;

post-distortion circuitry that updates the pre-distortion circuitry based on an output of the power amplifier; and a Finite Impulse Response (FIR) filter that is configured to receive the output of the power amplifier and provide one or more inputs to the post-distortion circuitry, wherein the cross-term circuit comprises at least one LUT and is configured to receive a first delayed version of an input sample, a second delayed version of the input sample, and a third delayed version of the input sample that is delayed by a different amount than the first delayed version of the input sample and the second delayed version of the input sample, wherein an instantaneous power of the second delayed version of the input sample is obtained by squaring an absolute value of the second delayed version of the input sample, wherein the at least one LUT is indexed based on the instantaneous power of the second delayed version of the input sample, wherein an output of the cross-term circuit corresponds to a multiplication of (i) a second exponential function applied to the second delayed version of the input sample with (ii) a multiplication of a first exponential function applied to the first delayed version of the input sample with a coefficient output from the at least one LUT, and wherein each LUT and coefficients of the FIR filter are updated together.

* * * * *